United States Patent [19]

Rahilly

[11] 4,094,730

[45] June 13, 1978

[54] METHOD FOR FABRICATION OF HIGH MINORITY CARRIER LIFETIME, LOW TO MODERATE RESISTIVITY, SINGLE CRYSTAL SILICON

[75] Inventor: W. Patrick Rahilly, Dayton, Ohio

[73] Assignee: The United States of America as represented by the Secretary of the Air Force, Washington, D.C.

[21] Appl. No.: 776,803

[22] Filed: Mar. 11, 1977

[51] Int. Cl.² .............................................. B01J 17/40
[52] U.S. Cl. .................................. 156/606; 156/620; 148/1.5
[58] Field of Search ................ 156/620, 606; 148/1.5, 148/187, 189

[56] References Cited

U.S. PATENT DOCUMENTS

| | | | |
|---|---|---|---|
| 3,167,512 | 1/1965 | Ziegler | 156/606 |
| 3,520,741 | 7/1970 | Mankarious | 148/175 |
| 3,895,965 | 7/1975 | MacRae | 148/1.5 |
| 3,895,966 | 7/1975 | MacDougall | 148/1.5 |
| 3,954,416 | 5/1976 | Keller | 156/620 |

FOREIGN PATENT DOCUMENTS 1,246,262  9/1971  United Kingdom ................ 156/620

*Primary Examiner*—Hiram H. Bernstein
*Attorney, Agent, or Firm*—Joseph E. Rusz; Robert Kern Duncan

[57] ABSTRACT

A polycrystalline rod of silicon is refined by repeatedly passing it through a zone melt condition, then a dopant impurity is ion implanted in the polycrystalline rod and a seed crystal is attached. A final zone melt pass is then made converting the rod to single crystal structure and distributing the dopant.

2 Claims, 4 Drawing Figures

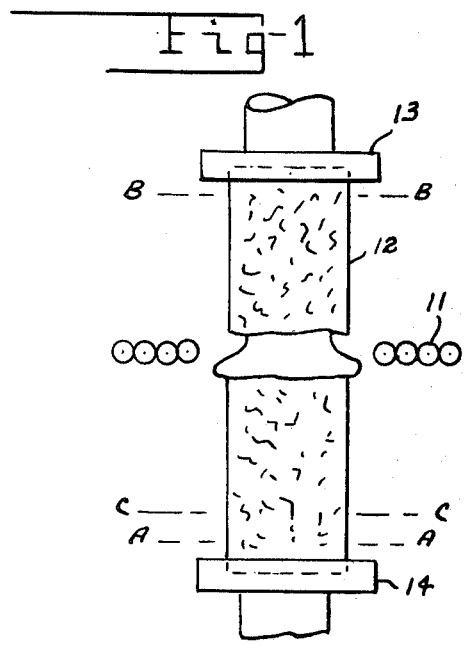
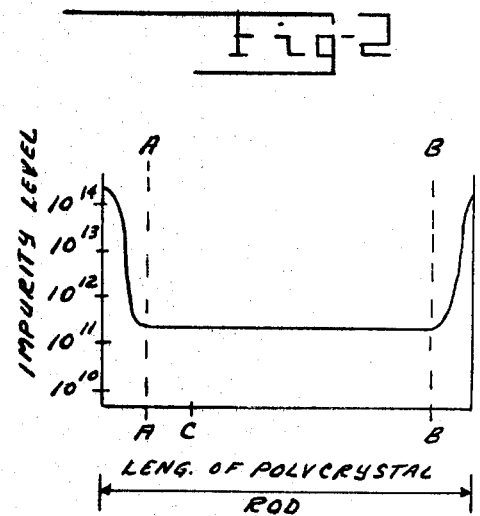
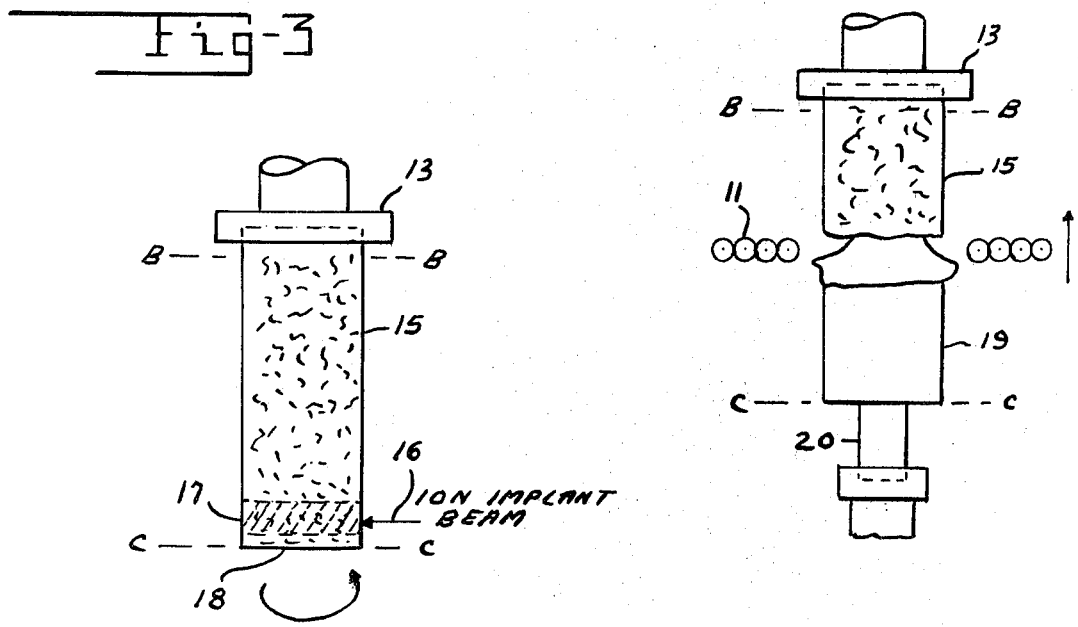

METHOD FOR FABRICATION OF HIGH MINORITY CARRIER LIFETIME, LOW TO MODERATE RESISTIVITY, SINGLE CRYSTAL SILICON

RIGHTS OF THE GOVERNMENT

The invention described herein may be manufactured and used by or for the Government of the United States for all governmental purposes without the payment of any royalty.

BACKGROUND OF THE INVENTION

The field of the invention is in the art of fabrication of single crystal semiconductor elements.

In the state of the art technology prior to this invention very high minority carrier lifetime (milliseconds) in silicon has been available but the resistivity of this material is far too high (greater than 5000 ohm-centimeters) for general use in the fabrication of semiconductor elements such as silicon solar cells. On the other hand, the prior art technology has provided lower more useful resistivities as is needed for silicon solar cells (0.1 ohm centimeter to 100 ohm centimeters), but the minority carrier lifetimes are typically 100 to 1000, or more, times lower than is desired and as is present in the very high resistivity material. The minority carrier lifetime problem for the 0.1 ohm centimeter to 100 ohm-centimeter resistivity range is not directly the result of the inherent resistivity of the material itself but is a result of how the silicon is processed into single crystal form and how it is doped with an electrical dopant to achieve the desired resistivity.

The prior problem of low minority carrier lifetime in low to moderate resistivity single crystal silicon is brought on directly by the presence of undesirable impurities (e.g., iron, tantalum, oxygen, carbon, copper, etc.) in the material. These unwanted impurities form "trapping" centers which trap the minority charge carriers and remove them from the energy conversion processes occurring in operational solar cells. Direct removal of these impurities in the low to moderate resistivity silicon significantly improves the conversion efficiency of solar cells. Typical examples of the prior art may be found in U.S. Pat. No. 3,366,462 to patentees Kersting et al, U.S. Pat. No. 3,925,105 and 3,933,528 to patentee Sloan.

SUMMARY OF THE INVENTION

High minority carrier lifetimes with low to moderate resistivity in single crystal semiconductor silicon is provided by uniquely combining the technologies of zone refining with that of ion implantation of electrical dopants. Through proper process control of the zoning, low to moderate resistivities with quite uniform electrical dopant distributions are obtained. The novel process herein disclosed typically provides single crystal semiconductor material in the resistivity range of 0.1 ohm centimeter to 100 ohm centimeters and with minority carrier lifetimes in the millisecond range. Typically, this represents a conversion efficiency of approximately 18 to 20% compared to 15 to 16% for the prior art devices.

BRIEF DESCRIPTION OF THE DRAWING

FIG. 1 is a schematic-pictorial representation of zone refining of polycrystal silicon rod;

FIG. 2 is a typical plot showing the results of zone sweeping the impurities to the ends of the rod;

FIG. 3 is a schematic-pictorial representation of implanting an electrical dopant by an ion implantation beam; and FIG. 4 is a schematic-pictorial representation of a zone melt pass transforming the polycrystalline rod to a single crystal and distributing the electrical dopant.

DESCRIPTION OF THE PREFERRED EMBODIMENT

The high minority carrier lifetimes attendant with very high resistivity silicon are observed since to concentration of unwanted impurities is reduced to very low levels (e.g., frequently below $10^{12}$ atoms per cubic centimeter). These very low levels of undesirable elements are the direct result of the zone refining process wherein frequently as many as seven "zone passes" may be used. The zone process "sweeps" out impurities because of the tendency of these impurities to reside in melted silicon rather than in solid silicon and thus their location in the silicon ingot can be controlled (swept to the ends of the ingot) by proper control of the localized or zone melt region. This zoning technique in addition to sweeping impurities from a region of the ingot is also used in conjunction with the distribution of the wanted introduction of a suitable electrical dopant such as boron, aluminum, or gallium for P type silicon, or phosphorus, arsenic or antimony for N type silicon.

The preferred method of providing this improved semiconductor material is to start with conventional raw silicon material in the form of a polycrystalline rod. The rod is zone refined by making several passes (typically five to seven) with conventional zone melt heater 11 in a conventional zone melt fixture as illustrated in FIG. 1. The polycrystalline rod 12 is conventionally supported by supports 13 and 14. As previously stated the impurities tend to remain and flow with the liquid state. Thus, heater 11 is energized approximately at position A—A and moved to position B—B sweeping impurities in the melt toward the upper end of the rod. At position B—B the direction of the heater 11 is reversed and moved toward A—A further catching and sweeping impurities not moved in the first pass toward the other end of the rod. After several passes, five to seven are recommended, the concentration of impurities in the rod is typically as illustrated by the plot shown in FIG. 2. Generally, it is not necessary to turn off the zone heater 11 between direction reversals, and, generally, the length of travel of the heater is the same for each pass. An additional slight improvement in impurity reduction for a given number of passes may be obtained by stopping the heater travel at progressively slightly greater and greater distances from the ends of the rod for each successive pass so as to preclude the picking up of previously swept out impurities. Another satisfactory alternative is to turn off the heater at the end of travel at the ends, allowing the rod to solidify, and then moving the heater slightly away from the end toward the center before re-energizing it so as to minimize catching any previously swept impurities. Using any of these techniques generally will effectively reduce all impurity concentrations in the bulk of the material to levels below $1 \times 10^{12}$ atoms per cubic centimeter of the silicon, as indicated in the region between A—A and B—B in FIG. 2.

The contaminated end comprising the bottom portion of the ingot below C—C is removed taking away the lower end with the swept out impurities and leaving a clean ingot below B—B and a new clean ingot end at C—C. The desired electrical dopant to provide P type or N type material (as previously explained) is then ion implanted by conventional ion beam 16 implantation as the ingot is rotated as illustrated in FIG. 3. Ideally, this ion implantation is performed without removing the crystal ingot 15 from the zone melt furnace fixtures so as to minimize the chances for contamination.

The polycrystalline rod ingot is rotated during implantation to establish a uniform band 17 of dopant. The duration time T of implantation in seconds is given by: $T = qMN/\rho I\alpha$ where $q$ = electronic charge (1.6 × $10^{-19}$ coulomb), M = mass of clean region of silicon ingot (gms), N = desired electrical dopant density level (atoms/cm$^3$), $\rho$ = density of silicon (2.33 gm/cm$^3$), $I$ = ion beam current (amperes, i.e., coulomb/sec), and $\alpha$ = dopant activation factor, i.e., fraction of implanted dopant electrically activated, (takes into account out gassing which results in some dopant not activated). An example of a typical practice of the invention for doping a 5 kilogram clean silicon ingot to provide P type silicon to provide improved semiconductor material is as follows. For one ohm-centimeter resistivity material the desired dopant density N is approximately 1.6 × $10^{16}$ atoms per cubic centimeter. A typical implant beam current is 50 milliamperes and from previous experimentation a typical dopant activation factor has been found to be 0.95. Thus, a typical time T in seconds is:

$$T = \frac{(1.6 \times 10^{-19})(5000)(1.6 \times 10^{6})}{(2.33)(50 \times 10^{-3})(.95)}$$

which is approximately 116 seconds or 1.93 minutes.

After the desired quantity and type of dopant is implanted in band 17 on the clean (except for the extreme top above B—B) polycrystalline ingot 15 a conventional single crystal "seed" crystal 20 is conventionally fused to the new clean bottom end 18 of ingot 15. Such seed crystals of detector grade single crystal silicon are well knwon and generally readily available. A single crystal zone melt pass is then made in the conventional manner by starting the zone heater 11 at the single crystal seed and sweeping it up the ingot converting the polycrystalline rod ingot 15 to single crystal structure 19 and distributing the dopant through the clean region of the crystal. During this step it is generally preferred to rotate the seed crystal to reduce the convection effects in the melt region and to ensure uniform radial distribution of the ion implanted electrical dopant. As freezing progresses the single crystal structure 19 will rotate with the single crystal seed 20. The zone heater 11 is stopped at or slightly before reaching location B—B. The improved crystal is then demounted from the holding fixture, the upper end containing impurities removed, and the clean crystal conventionally processed into conventional wafers for solar cell or other semiconductor usage.

I claim:

1. The method of fabricating a doped silicon single crystal of semiconductor material from a polycrystalline ingot rod of silicon, comprising the steps of:
   a. refining the said polycrystalline ingot by a plurality of zone melt passes moving impurities to an upper end and a lower end of the ingot;
   b. removing the said lower end of the said crystal providing a new clean end;
   c. implanting near the new clean end a dopant on the said polycrystalline rod by ion beam implantation;
   d. fusing a single crystal seed crystal to the said clean end;
   e. converting the said polycrystalline rod ingot to single crystal structure by a single crystal zone melt pass through the said seed crystal and the said polycrystalline ingot, stopping the said zone melt pass before reaching the said upper end of the ingot; and
   f. removing the upper end of the ingot providing a clean doped single crystal for semiconductor element fabrication.

2. The method as claimed in claim 1 wherein the step of converting the said polycrystalline rod ingot to single crystal structure includes rotating the said seed crystal.

* * * * *